United States Patent
Schwarzrock et al.

(10) Patent No.: US 6,605,828 B1
(45) Date of Patent: Aug. 12, 2003

(54) OPTOELECTRONIC COMPONENT WITH A SPACE KEPT FREE FROM UNDERFILLER

(75) Inventors: Günter Schwarzrock, Erfurt-Schwerborn (DE); Reiner Burgschat, Jena (DE); Andreas Schmidt, Erfurt (DE); Wolfgang Brode, Hermsdorf (DE); Wolfgang Holzapfel, Obing (DE); Peter Speckbacher, Kirchweidach (DE); Dieter Michel, Traunstein (DE)

(73) Assignee: Dr. Johanns Hudenheim GmbH, Traunreut (DE)

( * ) Notice: Subject to any disclaimer, the term of this patent is extended or adjusted under 35 U.S.C. 154(b) by 0 days.

(21) Appl. No.: 09/856,867

(22) PCT Filed: Nov. 25, 1999

(86) PCT No.: PCT/EP99/09123
§ 371 (c)(1),
(2), (4) Date: Jan. 2, 2002

(87) PCT Pub. No.: WO00/33022
PCT Pub. Date: Jun. 8, 2000

(30) Foreign Application Priority Data

Nov. 27, 1998 (DE) .......................................... 198 54 733

(51) Int. Cl.[7] .......................... H01L 27/15; H01L 31/12; H01L 33/00
(52) U.S. Cl. ............................. 257/81; 257/82; 257/678
(58) Field of Search ........................ 257/80–82, 88–95, 257/103, 431, 678

(56) References Cited

U.S. PATENT DOCUMENTS

| | | | |
|---|---|---|---|
| 4,122,479 A | * 10/1978 | Sugawara et al. | 357/19 |
| 4,770,923 A | * 9/1988 | Wasa et al. | 428/212 |
| 4,935,665 A | 6/1990 | Murata | |
| 5,272,355 A | * 12/1993 | Namavar et al. | 257/3 |
| 5,483,060 A | * 1/1996 | Sugiura et al. | 250/237 R |
| 5,670,781 A | * 9/1997 | Setbacken | 250/231.16 |
| 5,689,106 A | 11/1997 | Dahlin | |
| 5,786,589 A | 7/1998 | Segawa et al. | |
| 5,818,113 A | 10/1998 | Iseki et al. | |
| 6,017,681 A | * 1/2000 | Tsukamoto et al. | 430/321 |
| 6,175,414 B1 | * 1/2001 | Holzapfel et al. | 356/375 |
| 6,278,055 B1 | * 8/2001 | Forrest et al. | 136/263 |
| 6,281,592 B1 | * 8/2001 | Murayama | 257/796 |
| 6,303,998 B1 | * 10/2001 | Murayama | 257/778 |
| 6,329,062 B1 | * 12/2001 | Gaynor | 428/447 |

FOREIGN PATENT DOCUMENTS

JP 04-207072 7/1992
JP 05-6989 1/1993

OTHER PUBLICATIONS

English language abstract of Japanese publication 04–07072, Patent Abstracts of Japan, vol. 16, No. 542 (E–1290), Published by European Patent Office, Nov. 12, 1992, one page.

English language abstract of Japanese publication 05–06989, Patent Abstracts of Japan, vol. 17, No. 264 (E–1370), Published by European Patent Office, May 24, 1993, one page.

Pending Patent Application Assigned to Dr. Johannes Heidenhain GmbH: Ser. No.: 09/646801, Filing Date: Sep. 22, 2000, Inventor: Franz et al.

* cited by examiner

*Primary Examiner*—Amir Zarabian
*Assistant Examiner*—Monica Lewis
(74) *Attorney, Agent, or Firm*—Brinks Hofer Gilson & Lione

(57) ABSTRACT

An optoelectronic component that includes a substrate having a first optoelectronic component, a second optoelectronic component arranged next to the first optoelectronic component and a contact point. A support of the substrate includes a second contact point, wherein the second contact point is located opposite to the first contact point and is in electrical connection with the first contact point. An underfiller in a space between the substrate and the support, the underfiller forms a border area between the substrate and the support toward a space free of underfiller, wherein the border area restricts the space free of underfiller of at least one of the first and second optoelectronic components.

23 Claims, 4 Drawing Sheets

OPTOELECTRONIC COMPONENT WITH A SPACE KEPT FREE FROM UNDERFILLER

Applicants claim, under 35 U.S.C. §119, the benefit of priority of the filing date of Nov. 27, 1998 of a German patent application, copy attached, Ser. No. 198 54 733.1, filed on the aforementioned date, the entire contents of which is incorporated herein by reference.

BACKGROUND OF THE INVENTION

1. Field of the Invention

The present invention relates to an optoelectronic component, in particular a scanning unit of a position measuring device for linear and angular measurements.

2. Description of the Related Art

Such a component has been described in the journal F & M, issue 10, 1996, pages 752 to 756. A light-emitting diode is arranged on a photodiode array chip which, by flip-chip technology, or chip-on-glass technology, is connected via gold bumps with strip conductors on a transparent glass plate. The glass plate is also the support of the scanning grating. The space between the photodiode array chip and the glass plate is filled with a transparent underfiller, which contributes to the mechanical stabilization of the structure.

During position measuring by this component, the light of the light-emitting diode radiates through the scanning grating, falls on a scale and is reflected by the scale grating. The reflected light again passes through the scanning grating and falls on the photodiode array, where sinusoidal scanning signals are generated, which are phase-shifted with respect to each other. However, it is disadvantageous in this construction that the underfiller is a very good light conductor, which conducts a large portion of the light radiated by the light-emitting diode directly to the photodiodes of the photodiode array. A high direct light radiation from the light-emitting diode to the photodiodes occurs from the edge radiation of the light-emitting diode and scattered light, generated by scattering in the underfiller. This direct radiation considerably increases the light level of the scanning signals and leads to a detrimental ratio between useful signal and interference signal.

An optical component is known from DE 197 20 300 A1, wherein a light-emitting diode is implanted in a photodiode array.

SUMMARY OF THE INVENTION

An object of the present invention is based on disclosing an optoelectronic component, in particular a scanning unit for a position measuring device, which is compactly constructed and wherein the ratio of useful light to interfering light, and therefore the ratio of useful signal to interference signal, is improved.

This object is attained by an optoelectronic component that includes a substrate having a first optoelectronic component, a second optoelectronic component arranged next to the first optoelectronic component and a contact point. A support of the substrate includes a second contact point, wherein the second contact point is located opposite to the first contact point and is in electrical connection with the first contact point. An underfiller in a space between the substrate and the support, the underfiller forms a border area between the substrate and the support toward a space free of underfiller, wherein the border area restricts the space free of underfiller of at least one of the first and second optoelectronic components.

The advantages and objects achieved by the present invention reside in particular in that it is possible in a simple way to keep the space around the light source free of underfiller, and wherein a border area is created by the underfiller, which does not permit the light radiated by the light source to reach the light receivers directly, but instead absorbs or reflects the light. The ratio of the light components of useful light and interference light reaching the light receivers is improved. The level of equality of the scanning signals is reduced and the ratio of useful signal to interference signal is therefore improved.

Exemplary embodiments of the present invention will be explained in greater detail by the drawings.

BRIEF DESCRIPTION OF THE DRAWINGS

Shown are in.

DESCRIPTION OF THE PREFERRED EMBODIMENT(S)

Figure 1:
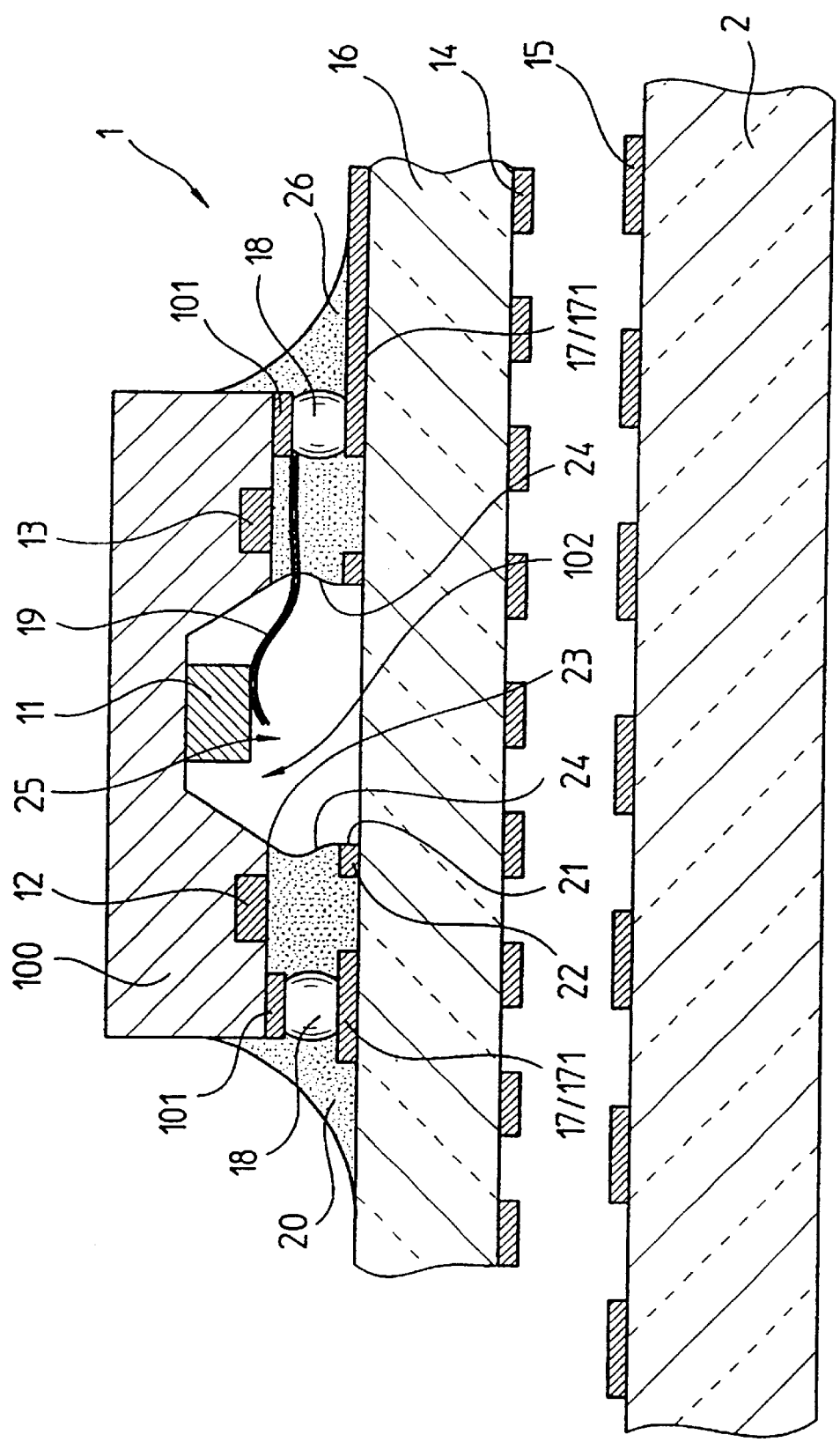
FIG. 1 shows a longitudinal cross-sectional view of a first embodiment of a scanning unit with a scale according to the present invention.

In the different exemplary embodiments described hereinafter, like elements are identified by the same reference numerals.

The examples shown represent an optoelectronic component in the form of a scanning unit of a position measuring device. This application is particularly advantageous. However, the invention is not limited to this application, an optoelectronic component can also be employed for detecting the light adsorption of layers, the reflection on surfaces, the light adsorption in gases, the refractive change of layers, the total reflection, as well as the remission, for example. Fields of application are, inter alia, gas sensor technology, fluid sensor technology, measurements of biological and human-medical parameters, pressure sensor technology, as well as inclination sensor technology.

A first exemplary embodiment of the present invention is represented in FIG. 1. The position measuring device includes an optoelectronic component in the form of a scanning unit 1, as well as a scale 2. The scanning unit I has a light source in the form of an LED 11, several light receivers 12, 13, and a scanning grating 14. The light from the LED 11 passes through the scanning grating 14, falls on the scale 2 and is reflected by the graduation 15 of the scale 2. The reflected light again passes through the scanning grating 14 and falls on the light receivers 12, 13. The portion of light of the LED 11 passing over this course is identified as useful light, since it contributes to the position-dependent modulation of the light. The relative arrangement of the light receivers 12, 13 of the scanning grating 14 and of the scale 2 has been selected in a known manner in such a way that the individual light receivers 12, 13 generate electrical sinusoidal scanning signals, which are phase-shifted with respect to each other. A symmetrical arrangement of a plurality of light receivers 12, 13 in the form of a photodiode array is particularly advantageous, wherein the LED 11 is arranged in the center. This arrangement is extensively described and represented in the journal F & M, issue 10, 1996, on pages 752 to 756, so that further explanations of this can be omitted.

The scanning grating 14 has been lithographically applied on a glass plate 16 in the form of an alternatingly light-permeable and light-impermeable bar code. The glass plate 16 is also used as the support for the LED 11 and for the light receivers 12, 13. For this purpose a strip conductor layout has been applied by a lithographic method on the side of the glass plate 16 opposite the scanning grating 14. This layout has strip conductors 17 with contact points 171 for face-down contacting.

The light receivers 12, 13 are advantageously constructed as a common unit in the form of an optical chip 100. The optical chip 100 is complemented by the LED 11 (semiconductor chip) placed on it. The LED 11 is in electrical contact with the optical chip 100. For contacting, the optical chip 100 has contact points 101, which point in the direction of the contact points 171 of the glass plate 16 and are connected with them via pumps 18 in accordance with flip-chip technology. The LED 11 can be placed directly on a level surface of the optical chip 100. But the LED 11 is advantageously implanted in the optical chip 100. This means that a depression 102 for receiving the LED 11 has been cut into the optical chip 100, such as described in DE 197 20 300 A1. The back of the LED 11 is placed into contact with the optical chip 100 by being placed on it by soldering or by a conducting adhesive.

The front of the LED 11 is brought into contact with the optical chip 100 by wire-bonding. The bonding wire is provided with the reference numeral 19.

After the optical chip 100 supporting the LED 11 and the light receivers 12 and 13 has been brought into electrical contact with the strip conductors 17 of the glass plate 16, the space between the optical chip 100 and the glass plate 16 is filled with an underfiller 20. The underfiller 20 is particularly used for the mechanical stabilization of the structure, it therefore includes a solidly setting plastic material of high strength and good adhesion on the optical chip 100 and on the glass plate 16.

To keep the space 25 in the area of the main radiating direction of the LED 11 free of underfiller 20, an edge 21, in particular a circumferential one, has been formed on the surface of the glass plate 16 located opposite the LED 11 in the first exemplary embodiment. This edge 21 prevents the further flow of the underfiller 20 from the area of the light receivers 12, 13 into the area of the LED 11. Therefore the edge 21 is called a flow edge 21 in what follows. This flow edge 21 can be applied by the same lithographic process as the strip conductors 17. Here, the flow edge 21 is constituted by a metallic layer structure 22, which is made of the same material as the strip conductors 17.

A further flow edge 23, in particular a circumferential one, is formed on the optical chip 100 opposite the flow edge 21.

This flow edge 23 can be constituted by a separate structure, or can be formed in the optical chip 100 by a depression or an elevation. In the example represented, the flow edge 23 is formed by the depression 102. The underfiller 20 is introduced from the outside into the space between the optical chip 100 and the glass plate 16, in the process it flows by capillary action as far as the flow edges 21, 23, where further flow is prevented. In this way the space between the LED 11 and the glass plate 16 can be kept free of underfiller in a simple way. A border area 24 between the underfiller 20 and the free space 25 is formed because of the flow edges 21, 23. This border area 24 is a surface of the underfiller 20, which considerably reduces the transmission of light emanating from the LED 11 in that the impinging light is reflected and/or absorbed.

Both flow edges 21 and 23 can be embodied as layer structures, as depressions, as elevations or as rough surfaces.

The underfiller 20 is transparent for the wavelength range in which the LED 11 transmits, which is detected by the light receivers 12, 13. It should have a thermal expansion coefficient which is matched to the components of the flip-chip structure and therefore does not cause any mechanical stresses. The underfiller 20 is customarily filled or mixed with quartz powder 26 or quartz spheres for matching and for reducing the expansion coefficient. Because of this, the surface of the underfiller 20 is relatively coarse at the border area 24, so that the transmission is further reduced.

The interference light reaching the light receivers 12, 13, and therefore also the level of equality of the scanning signals is considerably reduced. Moreover, the LED 11 is located in a free space 25 with air, which permits any arbitrary expansion of the LED 11. An accumulation of the underfiller 20 in the space of the LED 11 is prevented, because of this the mechanical stresses in the area of the LED 11 occurring in case of temperature changes are considerably reduced. A simple manufacture is possible, since the border area 24 does not constitute a mechanical barrier for the bonding wire 19. The border area 24 forms a sort of a light seal, wherein the bonding wire opening is automatically formed in accordance with the path of the bonding wire 19.

Figure 2:
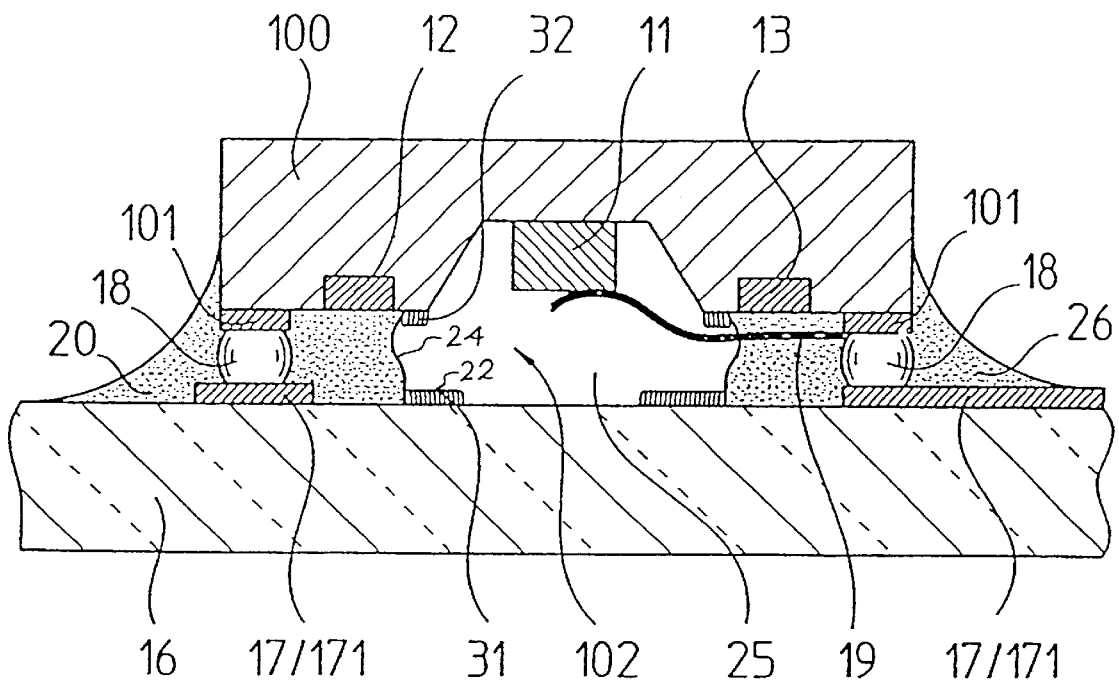
FIG. 2 shows a longitudinal cross-sectional view of a second embodiment of a scanning unit according to the present invention.

FIG. 2 shows a further example of a scanning unit. The basic structure corresponds to that in FIG. 1, so that only the characteristics differing from that will be explained in what follows.

In place of flow edges 21, 23, a different measure is provided for forming a border area 24. At the location at which further flowing of the underfiller 20 is to be prevented, the surface 31 of the glass plate 16 and the surface 32 of the optical chip 100 have been treated in such a way that the capability of these surface areas 31, 32 to be wetted has been greatly reduced. This measure is also called the application of water repellent. Here, the physical effect is the increase of the boundary layer tension of the surface areas 31 and 32 in order to reduce the capability to be wetted. The surface areas 31, 32 can be coatings of Teflon or diamond-like carbon. This measure can be employed alternatively or in addition to the measure in accordance with FIG. 1. If it is additionally employed, the surface area 31 of the glass plate 16 can also be the structure 22. It is also possible to combine the steps described in connection with FIGS. 1 and 2 with each other. In that case the structure 22 includes a layer forming a mechanical barrier and a sort of chemical barrier for the underfiller 20. The structure 22 is made, for example, of Teflon, or is a Teflon-chromium composition, i.e. a material which has little wetting capabilities.

Figure 3:
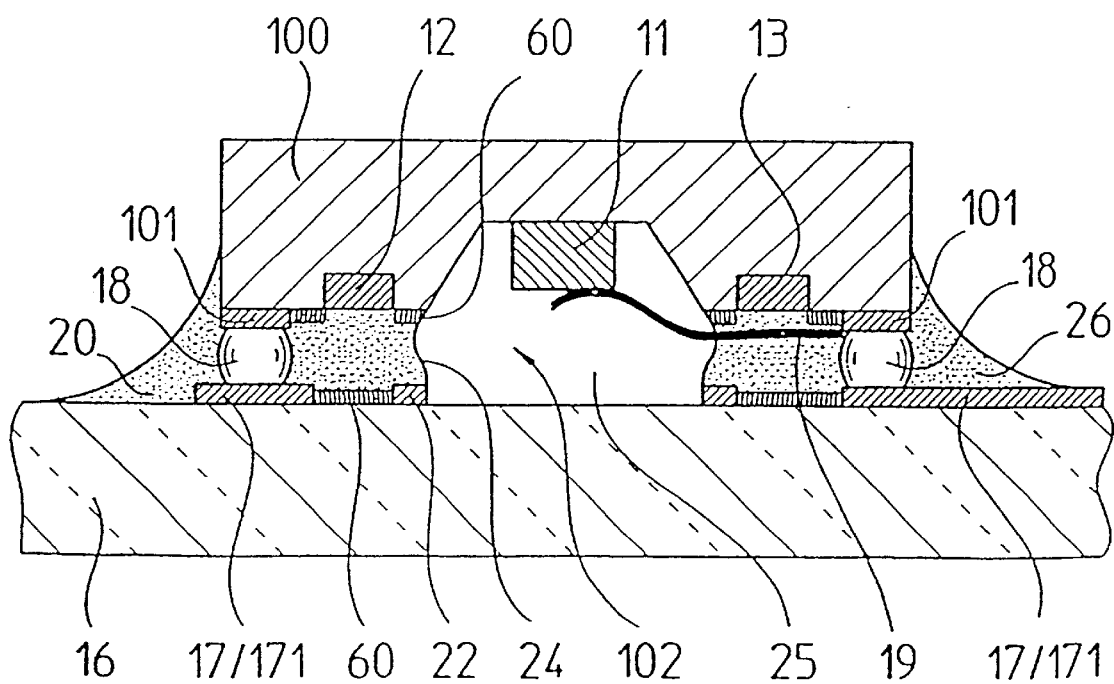
FIG. 3 shows a longitudinal cross-sectional view of a third embodiment of a scanning unit according to the present invention.

In addition, it is possible to purposely improve the wetting behavior of the glass plate 16 and of the optical chip 100 in the area into which the underfiller 20 is intended to flow satisfactory, in that this surface area is coated with a material 60, which has a large capability to be wetted. This capability to be wetted is considerably improved by a coating of hexamethyldisilazane, for example. An exemplary embodiment of this is represented in FIG. 3.

Figure 4:
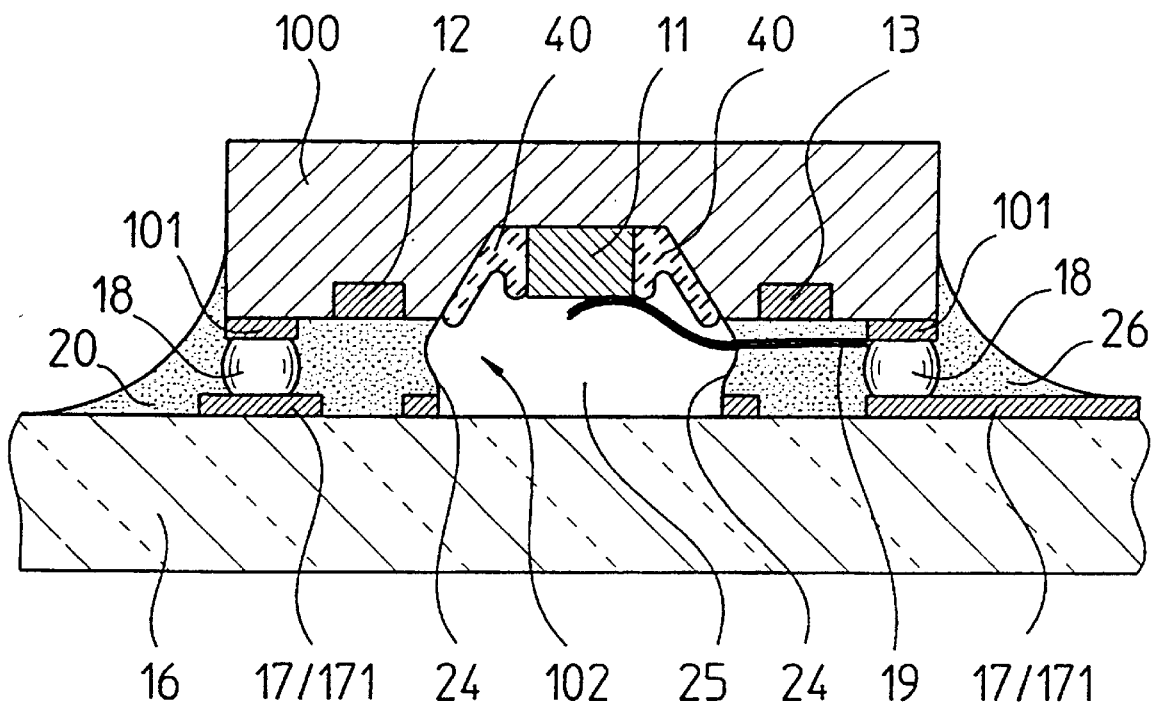
FIG. 4 shows a longitudinal cross-sectional view of a fourth embodiment of a scanning unit according to the present invention.

For a further reduction of scattered light it is possible to embody the lateral edges of the LED 11 and/or the surface areas of the optical chip 100 in the space 25 around the LED 11 so that they are absorbent. For this purpose, this surface of the optical chip 100 and/or the lateral edges of the LED 11 have a light-absorbing surface, for example in the form of a light-absorbing layer 40. This exemplary embodiment is schematically represented in FIG. 4.

Figure 5:
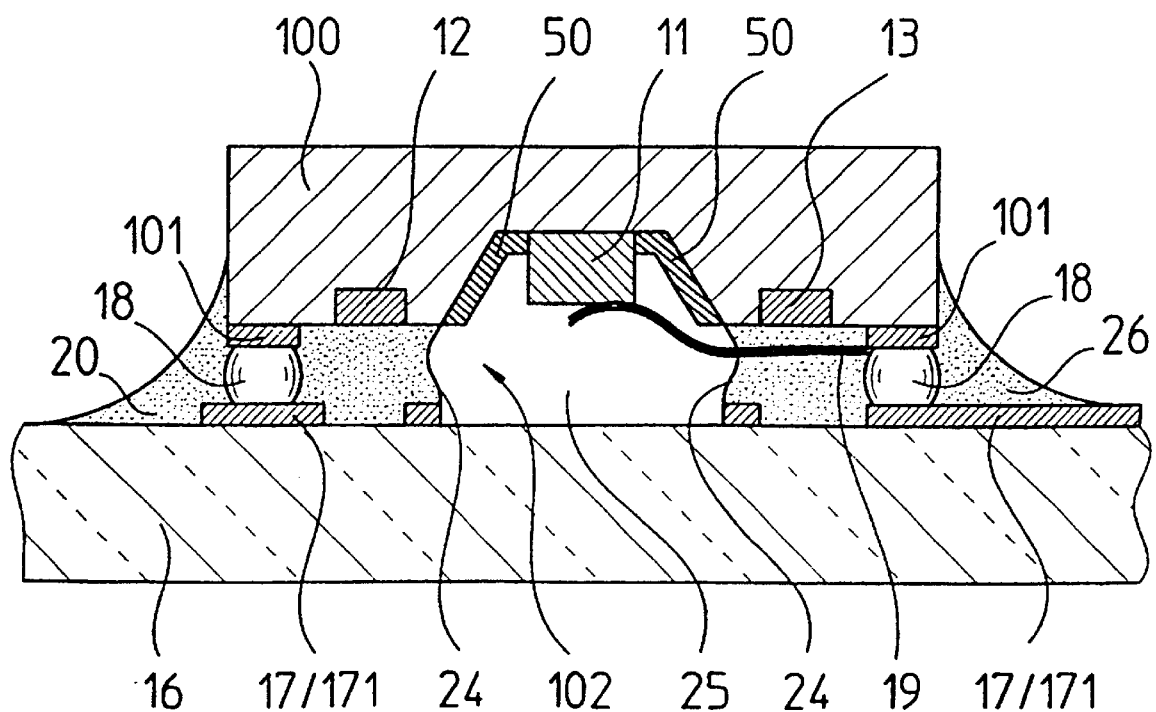
FIG. 5 shows a longitudinal cross-sectional view of a fifth embodiment of a scanning unit according to the present invention.

As an alternative, the lateral edges of the LED 11 and/or the surface of the optical chip 100 in the space 25 can be reflectively coated with layer 50. This example is schematically represented in FIG. 5.

Figure 6:
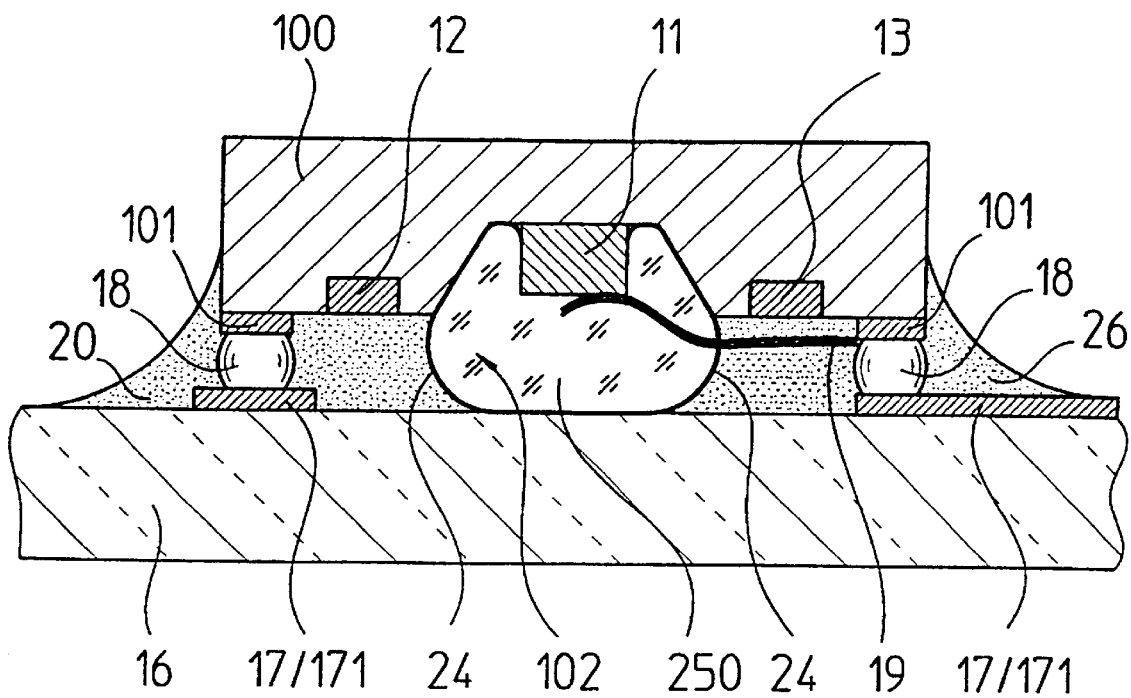
FIG. 6 shows a longitudinal cross-sectional view of a sixth embodiment of a scanning unit according to the present invention.

A sixth exemplary embodiment will be explained by means of FIG. 6. Here, an space is created in that a highly transparent material 250 is provided instead of air between the LED 11 and the glass plate 16. This transparent material 250 is preferably an elastic material, for example silicon, which only elastically connects the optical chip 100 with the glass plate 16. The LED 11 mounted on the optical chip 100 is enclosed in this material 250. The thickness of the material 250 is selected in such a way that, in the course of the placement and soldering of the optical chip 100 on the glass plate 16, it rests on the latter and fills and seals a space between the LED 11 and the glass plate 16 against the underfiller 20 to be introduced.

The elastic transparent material 250 can also be applied on the glass plate 16, wherein the space to be sealed again results from placing the optical chip 100 on the glass plate 16. The underfiller 20, which flows as far as the material 250 and there forms the border area 24, is introduced after the placement and soldering of the optical chip 100.

The provision of an elastic transparent material 250 in the area of the LED 11 has the further advantage that thermal expansion in this area cannot create stresses, since the elastic material 250 adapts itself. Moreover, no condensation is possible in this area. The required stability is achieved by means of the non-elastic underfiller 20, which rigidly connects the optical chip 100 with the glass plate 16. The underfiller 20 hardens into solidity and adheres well to the surfaces of the optical chip 100 and the glass plate 16.

Figure 7:
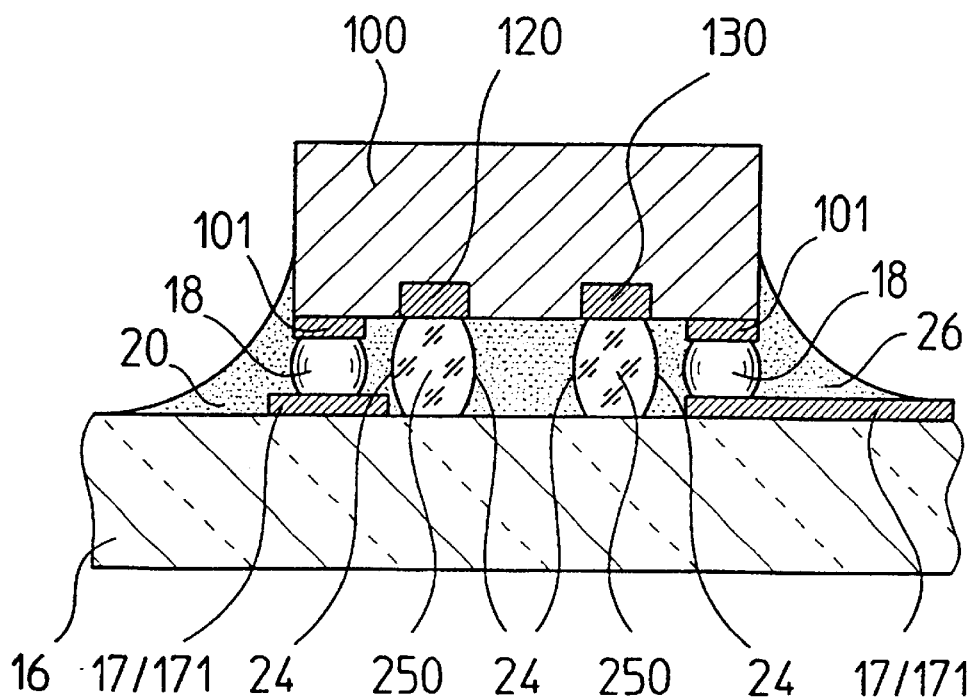
FIG. 7 shows a longitudinal cross-sectional view of a seventh embodiment of a scanning unit according to the present invention.

All measures described above can be employed alternatively or additionally also with light receivers 120 and 130 located next to each other, as has been represented only schematically in FIG. 7. Cross talk, caused by the scattering of useful light in the underfiller 20, is reduced here. By this the light-sensitive areas of the light receivers 120, 130 are kept free of the light-scattering underfiller 20 in a simple way. In the remaining areas of the optical chip 100, the underfiller 20 assures a solid connection with the glass plate 16. Moreover. with this embodiment it is not necessary for the underfiller 20 to be transparent, the underfiller 20 can even be designed to be opaque and have the function of a light blocking element, or screen element.

With all exemplary embodiments, the optical chip 100 can also contain circuits for processing the scanning signals from the light reception elements. The circuits for processing the scanning signals can also brought into contact with and fastened on the glass plate 16 as separate components manufactured in accordance with flip-chip technology.

In place of a glass plate 16, another transparent material, for example mylar, can be used as a support.

Furthermore, the scanning grating 14 can also be applied to the other side of the glass plate 16. This has the advantage that the scanning grating 14, the strip connectors 17 and the structure 22 for the flow edge 21 can be produced on the same surface and therefore in a common method process. In this case, the structure 22 for forming the flow edge 21 can be a part of the scanning grating 14.

The graduation 15 can be an incremental and/or a one- or multi-track absolute code graduation.

The invention may be embodied in other forms than those specifically disclosed herein without departing from its spirit or essential characteristics. The described embodiments are to be considered in all respects only as illustrative and not restrictive, and the scope of the invention is commensurate with the appended claims rather than the foregoing description.

What is claimed is:

1. An optoelectronic component comprising:
   a substrate comprising:
      a first optoelectronic component;
      a second optoelectronic component arranged next to said first optoelectronic component; and
      a first contact point;
   a support of said substrate comprising a second contact point, wherein said second contact point is located opposite to said first contact point and is in electrical connection with said first contact point;
   an underfiller in a space between said substrate and said support;
   said underfiller forms a border area between said substrate and said support toward a space free of underfiller, wherein said border area restricts said space free of underfiller of at least one of said first and second optoelectronic components.

2. The optoelectronic component in accordance with claim 1, wherein said border area of said underfiller directly borders a transparent underfiller-free space.

3. The optoelectronic component in accordance with claim 2, wherein a first edge is positioned on said substrate between said first and second optoelectronic components, and that on an opposite side of said substrate a second edge is formed on said support, and that said underfiller bridges a distance between said first and second edges, and said border area is formed there.

4. The optoelectronic component in accordance with claim 2, wherein a wettability of said substrate and said support is reduced in an area of said border area.

5. The optoelectronic component in accordance with claim 3, wherein a wettability of said substrate and said support is reduced in an area of said border area.

6. The optoelectronic component in accordance with claim 1, wherein said space free of underfiller is formed by a highly transparent material, which is bordered by said underfiller.

7. The optoelectronic component in accordance with claim 2, wherein said space free of underfiller is formed by a highly transparent material, which is bordered by said underfiller.

8. The optoelectronic component in accordance with claim 3, wherein said space free of underfiller is formed by a highly transparent material, which is bordered by said underfiller.

9. The optoelectronic component in accordance with claim 1, wherein said substrate comprises a light source and a light receiver located next to each other, and that a space between said light source and said support is free of said underfiller, and said border area separates said space free of said underfiller around said light receiver.

10. The optoelectronic component in accordance with claim 2, wherein said substrate comprises a light source and a light receiver located next to each other, and that a space between said light source and said support is free of said underfiller, and said border area separates said space free of said underfiller around said light receiver.

11. The optoelectronic component in accordance with claim 3, wherein said substrate comprises a light source and a light receiver located next to each other, and that a space between said light source and said support is free of said underfiller, and said border area separates said space free of said underfiller around said light receiver.

12. The optoelectronic component in accordance with claim 9, wherein said substrate comprises a semiconductor substrate, in which a plurality of light receivers are embodied, and on which said light source is fastened and electrically connected.

13. The optoelectronic component in accordance with claim 12, wherein said semiconductor substrate comprises a recess, into which said light source is inserted.

14. The optoelectronic component in accordance with claim 9, wherein a surface area of said light source in said space free of underfiller is embodied to be absorbing, in particular is coated.

15. The optoelectronic component in accordance with claim 13, wherein a surface area of said recess is embodied to be absorbing, in particular is coated.

16. The optoelectronic component in accordance with claim 13, wherein a surface area of said recess is reflectively coated.

17. The optoelectronic component in accordance with claim 9, wherein surface areas of said support, on which said underfiller is provided, are coated with a material, which has a great wetting capability.

18. The optoelectronic component in accordance with claim 9, wherein surface areas of said substrate, on which said underfiller is provided, are coated with a material, which has a great wetting capability.

19. An optoelectronic component comprising:
  a substrate comprising:
    a first optoelectronic component;
    a second optoelectronic component arranged next to said first optoelectronic component; and
    a first contact point;
  a support of said substrate comprising a second contact point, wherein said second contact point is located opposite to said first contact point and is in electrical connection with said first contact point;
  an underfiller in a space between said substrate and said support;
  said underfiller forms a border area between said substrate and said support toward a space free of underfiller, wherein said border area restricts said space free of underfiller of at least one of said first and second optoelectronic components, wherein said support comprises a transparent material, and a scanning grating is positioned on said support.

20. The optoelectronic component in accordance with claim 2, wherein said support comprises a transparent material, and a scanning grating is positioned on said support.

21. The optoelectronic component in accordance with claim 3, wherein said support comprises a transparent material, and a scanning grating is positioned on said support.

22. The optoelectronic component in accordance with claim 1, wherein said support comprises a strip conductor.

23. The optoelectronic component in accordance with claim 1, wherein said space free of underfiller reduces cross talk caused by scattering of light within said underfiller.

* * * * *

UNITED STATES PATENT AND TRADEMARK OFFICE
CERTIFICATE OF CORRECTION

PATENT NO. : 6,605,828 B1
DATED : August 12, 2003
INVENTOR(S) : Günter Schwarzrock et al.

It is certified that error appears in the above-identified patent and that said Letters Patent is hereby corrected as shown below:

<u>Title page,</u>
Item [73], Assignee, delete "Hudenheim" and substitute -- Heidenhain -- in its place.

Signed and Sealed this

Twenty-ninth Day of June, 2004

JON W. DUDAS
*Acting Director of the United States Patent and Trademark Office*